United States Patent [19]

Saari

[11] Patent Number: 4,658,219
[45] Date of Patent: Apr. 14, 1987

[54] FOLDED CASCODE FIELD-EFFECT TRANSISTOR AMPLIFIER WITH INCREASED GAIN

[75] Inventor: Veikko R. Saari, Spring Lake Heights, N.J.

[73] Assignee: AT&T Bell Laboratories, Murray Hill, N.J.

[21] Appl. No.: 814,198

[22] Filed: Dec. 27, 1985

[51] Int. Cl.$^4$ ............................................. H03F 3/45
[52] U.S. Cl. ................................... 330/253; 330/255; 330/311
[58] Field of Search ................. 330/253, 258, 311, 255

[56] References Cited

U.S. PATENT DOCUMENTS 4,284,958  8/1981  Pryor et al. ...................... 330/311 X

OTHER PUBLICATIONS

1983 *IEEE International Solid-State Circuits Conference*, "Session XVII, Precision Analog Components", T. C. Choi, R. T. Kaneshiro, R. Brodersen, P. Gray, W. Jett and M. Wilcox: ISSCC 83/Friday, 2/25/83, Imperial Ballroom B/11:15 a.m., pp. 246, 247 and 314.

*IEEE Journal of Solid-State Circuits*, "High-Frequency CMOS Switched-Capacitor Filters for Communications Application", T. Choi, R. T. Kaneshiro, R. W. Brodersen, P. R. Gray, W. Jett and M. Wilcox, vol. sc-18, No. 6, Dec. 1983.

Primary Examiner—James B. Mullins
Attorney, Agent, or Firm—Volker R. Ulbrich

[57] ABSTRACT

A fully differential CMOS operational amplifier (10) of the folded cascode type has a differential input network (12) and a transimpedance stage (14). The transimpedance output stage (14) is made up of two similar negative and positive signal branches (32,34) connected in parallel with each other between supply voltage nodes (V+,V−). Each signal branch includes a P-channel current source transistor (48,60), a cascode transistor (50,62), an N-channel a pull-down transistor (40,52), and an N-channel current source transistor (42,54), all connected in tandem, respectively, between a positive supply voltage node and the drain of a feedback transistor (44,56), which has its source connected to a negative supply voltage node. The drains of the feedback transistors of the two branches are joined. A second cascode transistor (64,66) has its source connected to the source of the first cascode transistor (50,62) and its drain connected to the source of the pull-down transistor (40,52) to increase the output impedance at the drain of the first cascode transistor without affecting the signal current-carrying capability of the signal branches (32,34) by permitting the cascode transistors and the pull-down transistors connected to the output nodes to have a reduced width-to-length ratio.

3 Claims, 1 Drawing Figure

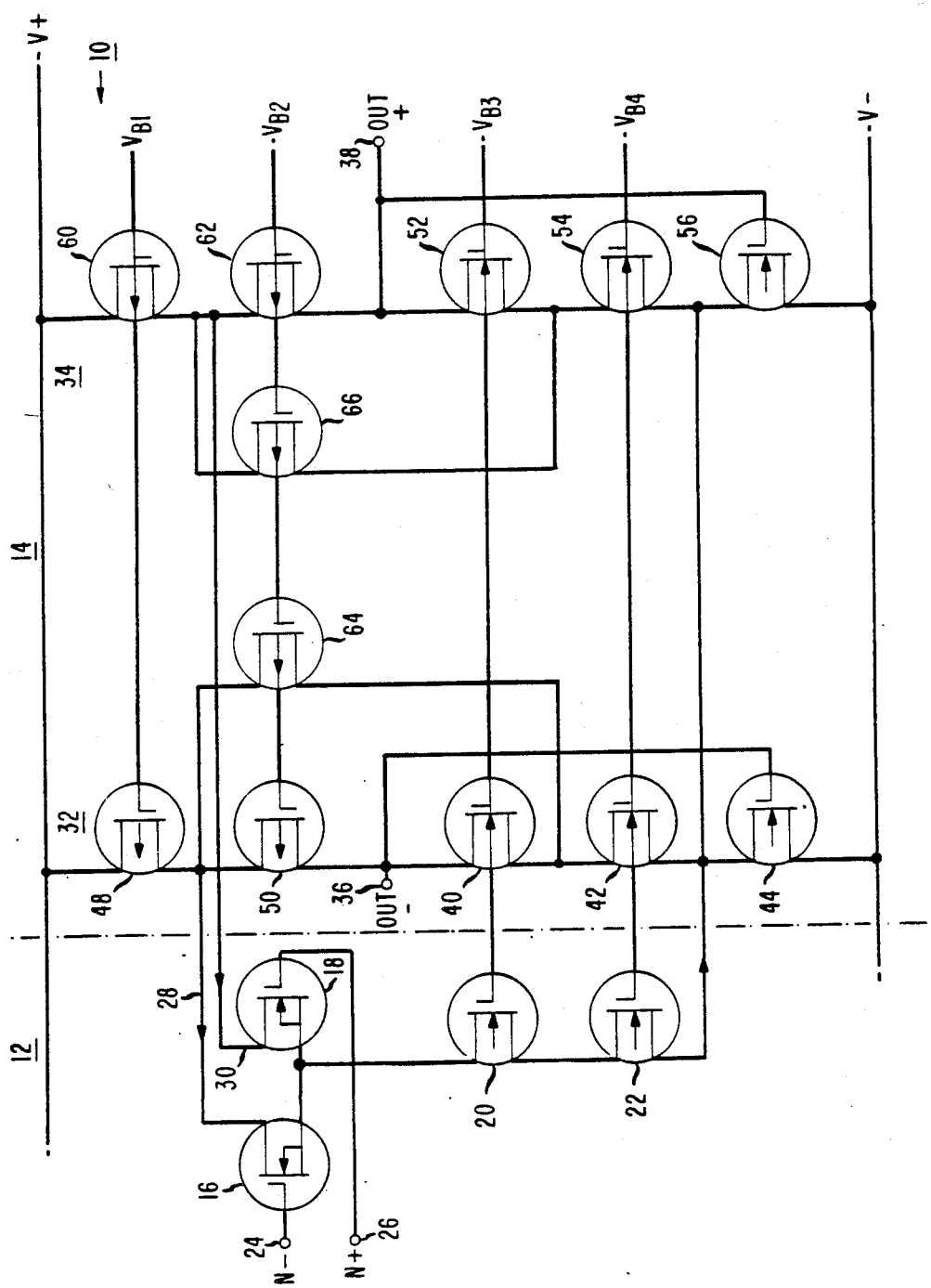

FOLDED CASCODE FIELD-EFFECT TRANSISTOR AMPLIFIER WITH INCREASED GAIN

Technical Field

The invention relates to electronic amplifiers, particularly monolithic fully double-ended operational amplifiers implemented with field-effect transistors.

BACKGROUND OF THE INVENTION

Fully double-ended operational amplifiers typically include an input stage and a transimpedance stage, which may be the output stage. The transimpedance stage may be simply a pair of single-ended transimpedance signal branches which are identical to each other, with each receiving one of the signals from the input stage. An example of a fully differential monolithic operational amplifier implemented in complementary metal-oxide-silicon (CMOS) technology is described in "High-Frequency CMOS Switched-Capacitor Filters for Communications Application" by T. C. Choi et al. in IEE Journal of Solid State Circuits, vol. SC-18, No. 6, Dec. 1983, pp. 652–664. In the arrangement described therein the output stage is made up of a parallel pair of mutually identical folded cascode signal branches, connected between two supply voltage nodes.

The performance of the amplifier depends in large part on a high open loop gain achieved by means of a high output impedance for the signal branches. There is a tradeoff in these characteristics. If the cascode transistors in the signal branches are made with a relatively low width-to-length ratio conduction channel for increased gain, then the output impedance of the branches is reduced accordingly.

SUMMARY OF THE INVENTION

In accordance with the present invention, each signal branch of a fully double-ended folded cascode field-effect transistor amplifier circuit includes a second cascode transistor having its source connected to the source of the first cascode transistor and its drain connected to the source of a pull-down transistor, so that the pull-down transistor feeds part of the signal to the output node as a cascode device. With this arrangement, the width-to-length ratios of the transistors connected to the output nodes can be substantially reduced for an increase in the output impedance, while the output current drive capability of the amplifier is maintained. This results in an amplifier with increased open loop gain and reduced distortion.

BRIEF DESCRIPTION OF THE DRAWING

The drawing figure shows a fully double-ended CMOS amplifier having a transimpedance amplifier output stage with two signal branches in accordance with a preferred embodiment of the invention.

DETAILED DESCRIPTION

The amplifier 10 shown in the drawing is a fully differential CMOS operational amplifier of the folded cascode type. The amplifier 10 includes a differential input network 12 and a transimpedance output stage 14, both connected between a positive supply voltage node V+ and a negative supply voltage node V−. All the transistors of the amplifier 10 are CMOS devices of the enhancement mode type. Reference to the connection of a transistor as such means the connection of its conduction channel, that being the source-drain path. The control electrode is referred to as a "gate." The connections of the bulk regions of the transistors to a suitable voltage would be readily apparent to one skilled in the art and are therefore not shown in order to avoid any unnecessary and distracting drawing details. Reference voltages are voltages which are constant relative to the signal and which may be supplied by any appropriate available source. An example of a biasing circuit for supplying the bias voltages is also disclosed in the above-mentioned Choi et al. publication.

The input network 12 has a differential pair of N-type conduction channel input transistors 16,18 with their sources connected to a current source formed by an N-type cascode transistor 20 and an N-type bias current transistor 22 connected in series. The gates of the input transistors 16,18 form positive and negative signal input nodes, respectively, while their respective drains 28,30 feed signal currents to the output stage 14.

The output stage 14 has negative and positive signal branches 32,34, which have a negative signal output node 36 and a positive signal output node 38 in their respective current paths.

In the negative branch 32, an N-type pull-down transistor 40, and an N-type bias current transistor 42 are connected together in tandem between the output node 36 and the drain of a feedback transistor 44, which has its source connected to the negative supply voltage node V− and its gate connected to the output node 36. A current source transistor 48 and a cascode transistor 50, both P-type, are connected in tandem, respectively, between the positive supply voltage node V+ and the negative output node 36, their common node being connected to the drain 28 of transistor 16, which constitutes an input node of the output stage 14. A second cascode transistor 64 is connected between the source of the first cascode transistor 50 and the source of the pull-down transistor 40.

In the positive signal branch 34, an N-type pull-down transistor 52 and an N-type bias current transistor 54 are connected in tandem between the positive output node 38 and the drain of a an N-type feedback transistor 56, which has its source connected to the negative supply voltage node V− and its gate connected to the output voltage node 38. The drains of the feedback transistors 44 and 56 are connected together so that the devices have a common mode output. A bias current transistor 60 and a cascode transistor 62, both P-channel, are connected in tandem between the positive supply voltage node V+ and the positive output node 38, their common node being connected to the drain 30 of the transistor 18, which constitutes the second input node of the output stage. A second cascode transistor 66 is connected between the source of the first cascode transistor 62 and the source of the pull-down transistor 52.

The gates of the current source transistors 48 and 60 are connected to a reference voltage $V_{B1}$, which is lower than the positive supply voltage V+. The gates of all four cascode transistors 50, 62, 64, 66 are connected to a reference voltage $V_{B2}$, lower than $V_{B1}$. The gates of the cascode transistor 20 of the input network 12 current source and of the pull-down transistors 40 and 52 are connected to a reference voltage $V_{B3}$, lower than $V_{B2}$. The gates of the bias current transistor 22 of the input network 12 current source and of the bias current transistors 42 and 54 are connected to a reference voltage $V_{B4}$, less positive than $V_{B3}$. The source of the bias current transistor 22 of the input network 12 is connected to the common drain node of the feedback transistors 44 and 56. The connection of the feedback transistors 44,56 in this manner forms a current source which supplies a current proportional to the common mode component of the output voltages, which are the voltages at the output nodes 36,38.

The operation of the circuit 10 in a general sense is well understood to those in the art and is discussed in the above-mentioned Choi publication. The additional, second cascode transistors 64,66 in the branches 32,34 are identical to the first cascode transistors 50,62. However, all four of the cascode transistors 50, 62, 64, 66 have conduction channel width-to-length ratios which are reduced to half of what they would be for the cascode devices 50,62 in the absence of the second cascode devices 64,66. They therefore have twice the drain-to-source resistance. The pull-down transistors 40 and 42 have also been reduced to half their size and their drain-to-source resistance has likewise been doubled. These N-type transistors 40,42 therefore now function as cascode loads, carrying the respective signal currents transmitted to the output nodes 36 and 38 by the P-channel second cascode transistors 64 and 66. Since these operate with a lower current density with this arrangement of the cascode transistors 50,62,64,66, they have a higher output impedance. This improves the open loop gain of the amplifier 10.

An advantageous feature of the circuit 10 is that the signal-current transmission capability of the first cascode transistors 50 and 62, combined with that of the double-cascode pairs 64, 40 and 62, 52 to the output nodes is the same as would be the transmission capability of the cascode transistors 50 and 62 alone with twice the width-length ratio. This is with no change in the total bias current consumption of the output stage 14. Yet, the open loop gain is doubled.

Another advantageous feature of the circuit 10 is the connection of the source of the current transistor 22 of the input network 12 directly to the primary negative bias current source of the amplifier 10, that being to the common drain node of the feedback transistors 44 and 56, rather than to another source that imperfectly tracks. This provides the input network 12 and output stage 14 with a bias current from a common pool and thereby almost fully correlates the noise in the bias current of the input network 12 to that of the bias current of the output stage 14, resulting in significant cancellation. It also reduces a common mode output voltage error for a somewhat similar reason.

It will be readily apparent to those skilled in the art how to implement a circuit in accordance with the invention with the roles of the N-type and P-type devices reversed, in which case the configuration of the devices will be a mirror image of that of the circuit 10.

What is claimed is:

1. A fully double-ended complementary field-effect transistor amplifier circuit of the type including a differential input network and a folded cascode transimpedance stage, the transimpedance stage having first and second signal output branches, each comprising:

a current source transistor having its control electrode connected to a first reference voltage node and a cascode transistor having its control electrode connected to a second reference voltage node, both transistors having a conduction channel of a first conductivity type connected in tandem, respectively, between a first polarity supply voltage node and a signal output node;

a pull-down transistor having its control electrode connected to a third reference voltage node and a bias current transistor having its control electrode connected to a fourth reference voltage node, both having conduction channels of a second conductivity type connected in tandem, respectively, between the signal output node and the drain of a feedback transistor which has its source connected to a second polarity supply voltage node and its gate connected to the output node,

WHEREIN THE IMPROVEMENT COMPRISES:

a second cascode transistor in each of said branches, said second transistor also having a conduction channel of the first conductivity type, its source being connected to the source of the first cascode transistor, its drain being connected to the source of the pull-down transistor, and its control electrode being connected to the second reference voltage node.

2. The circuit defined in claim 1 wherein the first and second cascode transistors have the same device geometries.

3. The circuit defined in claim 2 wherein the input network comprises a current source which is connected at one side to the source of first and second input transistors and at the other side to the drains of the feedback tansistors of the output signal branches.

* * * * *